United States Patent [19]

Chai et al.

[11] 4,382,840
[45] May 10, 1983

[54] HYDROTHERMAL CRYSTAL GROWING PROCESS AND APPARATUS

[75] Inventors: Bruce H. Chai, Bridgewater; Ernest Buehler, Chatham; John J. Flynn, Millington, all of N.J.

[73] Assignee: Allied Corporation, Morris Township, Morris County, N.J.

[21] Appl. No.: 230,075

[22] Filed: Jan. 30, 1981

[51] Int. Cl.³ .............................................. C30B 7/10
[52] U.S. Cl. .............................................. 156/623 R
[58] Field of Search ....... 156/623 R, 623 Q, DIG. 70, 156/DIG. 61; 432/311; 423/305, 626; 266/233

[56] References Cited

U.S. PATENT DOCUMENTS

| 2,675,303 | 4/1954 | Sobek et al. | 156/623 Q |
| 3,271,114 | 9/1966 | Kolb | 156/623 R |
| 4,247,358 | 1/1981 | Au Coin et al. | 156/623 R |
| 4,300,979 | 11/1981 | Kolb et al. | 156/623 R |
| 4,324,773 | 4/1981 | Chai et al. | 156/623 R |

FOREIGN PATENT DOCUMENTS 54-69595  6/1979  Japan .............................. 156/623 R

OTHER PUBLICATIONS

Drafall et al., "The Growth of Berlinite Single Crystals", from Litton Systems and Rome Air Development Center, 3/1980.
Kolb et al., "Hydrothermal Synthesis of AlPO₄," from 31st Annual Frequency Control Symp., Jul. 1977, Bell Laboratories.

Primary Examiner—Hiram H. Bernstein
Attorney, Agent, or Firm—James Riesenfeld; Gerhard H. Fuchs

[57] ABSTRACT

Large single crystals of berlinite are grown onto seed crystals by maintaining the crystals at a fixed elevated temperature in a pressure vessel containing a nutrient of coarse berlinite crystalline powder, held at a fixed lower temperature, and concentrated phosphoric acid. Because berlinite shows retrograde solubility, the nutrient goes into solution, and berlinite deposits on the higher-temperature growing crystal. The vessel is rocked to promote motion of saturated solution to the crystal and depleted solution to the nutrient. Large single crystals of alpha-gallium orthophoshate may be grown using the same apparatus and a similar process. The resultant crystals may be cut into wafers useful in surface acoustic wave devices.

21 Claims, 5 Drawing Figures

HYDROTHERMAL CRYSTAL GROWING PROCESS AND APPARATUS

DESCRIPTION

BACKGROUND OF THE INVENTION

1. Field of the Invention

This invention relates to a process and apparatus for growing single crystals of alpha-aluminum orthophosphate and alpha-gallium orthophosphate.

2. Description of the Prior Art

Alpha-aluminum orthophosphate (berlinite) and alpha-gallium orthophosphate ($GaPO_4$) are among several alpha-quartz isomorphs that have for decades been synthesized for research purposes. An attempt to grow large single crystals of berlinite began after World War II, in an effort to find new piezoelectric crystals for frequency control applications. The project ended a few years later, because success was achieved in quartz crystal growth and because quartz was considered superior for the piezoelectric devices known then. Specifically, it was concluded that berlinite had a lower Q and lower coupling coefficient than quartz. Furthermore, tests on both X and Y cuts of berlinite plates, showing a negative frequency drift with increasing temperature, indicated that there was little chance of finding a zero temperature cut similar to the AT cut of quartz.

Interest in berlinite was renewed in 1976, when Barsch and Chang found that berlinite does have temperature-compensated cuts and that the coupling coefficient for surface acoustic wave (SAW) devices can be four times greater than for quartz.

Several processes for preparing berlinite have been reported in the technical literature (W. Jahn et al., Chem. Erde 16, 75 (1953); J. M. Stanley, Ind. Eng. Chem. 46, 1684 (1954); E. D. Kolb et al., J. Crystal Growth 43, 313 (1978)).

Generally, two types of processes are described, the slow-heating method and the temperature gradient method. In a typical process, seed crystals are suspended near the bottom of a vertical autoclave are nutrient powder is suspended in a basket at the top. Both seed and nutrient are immersed in concentrated phosphoric acid. In one variation of the process, the temperature is raised from about 150° C. to about 190° C. at about 2° C./day. In another variation, a temperature gradient is maintained in the autoclave.

Recently, Drafall and Belt, of the Rome Air Development Center, have developed a combination process in which a constant temperature gradient is maintained in the autoclave as the temperature is raised about 10° C. in about 14 days. The quality of the crystals they produce, however, was not satisfactory for device applications (RADC-TR-80-73, Final Technical Report, March, 1980).

SUMMARY OF THE INVENTION

In accordance with the present invention, an apparatus is provided for growing single crystals of alpha-aluminum is orthophosphate or alpha-gallium orthophosphate. The apparatus comprises, in combination,
   (a) a pressure vessel comprising substantially cylindrical walls,
   (b) means for suspending a seed crystal in the vessel,
   (c) baffle means for dividing the vessel into a plurality of longitudinally-spaced communicating chambers,
   (d) means for supporting the vessel with its cylinder axis in a substantially horizontal orientation,
   (e) means for rocking the vessel about a horizontal axis normal to the cylinder axis, and
   (f) heating means for controlling temperatures in the vessel.

In operation, the present invention provides a process for growing single crystals of a metal orthophosphate selected from the group consisting of alpha-aluminum orthophosphate and alpha-gallium orthophosphate. The process comprises the steps of
   (a) suspending a seed crystal of the metal orthophosphate in a first chamber of a substantially horizontally-oriented pressure vessel, said first chamber being partitioned from at least one additional chamber with a substantially vertical baffle, through which fluid may flow,
   (b) introducing into a second chamber of the vessel a quantity of coarse crystalline powder of the metal orthophosphate,
   (c) partially filling the vessel with concentrated phosphoric acid,
   (d) sealing the vessel,
   (e) heating the vessel to achieve a seed crystal temperature in the range of about 135° C. to 210° C. and a powder temperature about 5° C. to 30° C. lower,
   (f) maintaining the temperatures in the vessel while rocking the vessel about a horizontal axis to raise first one end of the vessel and then the other, whereby the seed crystal grows from an acid solution of the metal orthophosphate,
   (g) cooling the vessel to near ambient temperature, and
   (h) recovering the resultant single crystal.

Among the advantages of the present process and apparatus are high yield, low cost, reproducible results, and scale-up capability. The single crystals that result find applications in SAW devices.

DETAILED DESCRIPTION OF THE INVENTION

Figure 1:
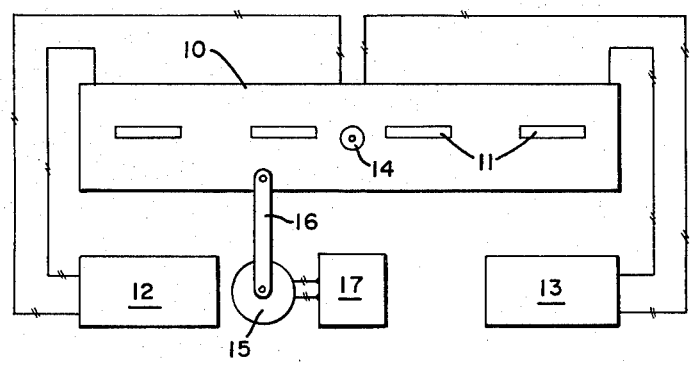
FIG. 1 is a schematic of an apparatus of the present invention.

This invention provides an apparatus for preparing single crystals of isomorphs of alpha-quartz, such as berlinite and $GaPO_4$. For convenience, the apparatus and procedure for growing berlinite crystals is described below; except where noted, the preparation of $GaPO_4$ crystals is identical.

The apparatus comprises a horizontally-mounted, substantially cylindrical pressure vessel for containing the materials of the process; means for heating the vessel and maintaining it at a predetermined temperature gradient; and means for periodically rocking the vessel about a horizontal axis normal to its cylinder axis.

The pressure vessel is adapted for holding concentrated phosphoric acid, in which is immersed, in one chamber, one or more berlinite seed crystals, and, in one or two adjoining chambers, coarse berlinite crystalline powder (or nutrient). (Of course, when $GaPO_4$ crystals are being grown, the seed and nutrient are of that material.) The vessel walls are preferably transparent to permit observation of the growth process. Fused silica is a preferred material for the pressure vessel. Flame-sealed tubes are suitable; however, demountable seals are preferred, because they are easier to use, reusable, and less prone to leakage or explosion.

For convenience of loading, unloading, and cleaning the vessel, it is preferably a tube, having a demountable seal at each end. Each seal may comprise an elastomer gasket for mounting between a fluoropolymer plug and the tube. The plug and gasket are preferably resistant to the high temperature and pressure and corrosive environment in the vessel. Polytetrafluoroethylene (PTFE) is a suitable fluoropolymer and Viton ® is a suitable gasket material.

Each chamber of the vessel is separated from the adjoining chamber(s) by a substantially vertical baffle. The baffle serves to maintain a temperature gradient between the chambers, while, at the same time, permitting liquid to flow between the chambers. Thus, the baffle material is desirably thermally insulating and resistant to the corrosive environment and high temperatures in the pressure vessel. Fluoropolymers such as PTFE are preferred. Particularly suitable is a substantially circular disk, whose circumference fits loosely to the inside of the vessel wall. To permit fluid passage, the baffle has one or more through holes, whose cross-sectional area is about 5-20% of that of the baffle. Preferably, the baffle has a single hole, covering about 10% of its area. There is less plugging when there is only one hole. The hole area is a compromise—a large hole limits the temperature gradient and a small hole restricts fluid flow between the chambers.

At the start of the process, berlinite seed crystals are suspended in a chamber of the vessel. The seed crystals are prepared by a process known in the art; for example, the process described by Krauss et al. (Z. Naturforschung, 30 A, 28 (1975)). Suitable seed crystals prepared by Krauss's method are single crystals at least 5 mm across. Preferably, a plurality of seed crystals are used, their orientation and positioning chosen to maximize growth rate, minimize crystal defects, and avoid contacting growing crystals with the vessel wall.

The seed crystals are suspended from fluoropolymer seed hangers mounted on a frame formed of a corrosion-resistant material. Platinum wire frames, having sufficient springiness to push against the vessel walls for support, have been used satisfactorily. The seed hangers may be conveniently fabricated from PTFE sheet about 1.5 mm-4 mm thick. The platinum wire passes through a hole at the top of each hanger, and the seed is gripped by two spaced-apart fingers at the bottom. The fluoropolymer seed hanger has several advantages over those of the prior art. There is no need to drill into the seed, which simplifies the use of the hanger, reduces the risk of damage to the seed, and minimizes strain near the point of seed support. Furthermore, the hanger is easy to fabricate and nucleation on the hanger is reduced.

Preparation of the coarse berlinite powder, or nutrient, that is used in the present process is disclosed and claimed in an application Ser. No. 230,077 entitled "Hydrothermal Process and Apparatus for Synthesizing Crystalline Powders," filed Jan. 30, 1981 and commonly assigned by the present applicants. The disclosure of that application is incorporated herein by reference.

The preferred particle size for the nutrient is about 20-60 mesh.

The nutrient is introduced into one or more chambers adjoining that which holds the seed crystals. Preferably, the nutrient is contained in a pervious enclosure that permits liquid flow-through while retaining all but the smallest nutrient particles. Fluoropolymer screen is a suitable material for the enclosure. PTFE screen, having in the range of between 95-126 mesh openings, has been used successfully. It is important that small particles of nutrient do not make their way to a growing crystal and become incorporated in it. Orienting the vessel horizontally reduces that possibility.

Concentrated phosphoric acid is introduced into the vessel in an amount of submerge the nutrient and seed crystals. Electronic grade 85% $H_3PO_4$ is commercially available and suitable. Preferably, the initial acid molarity is in the range of between about 5-9 M, with 7.3 M preferred (when $GaPO_4$ is being prepared, higher acid molarity, about 8-12 M, is preferred, with about 10 M most preferred). As much acid as possible is introduced into the vessel to maximize the yield; however, if more than 85 percent of the vessel is filled at ambient temperature, then the entire vessel will be filled at about 210° and excessive pressure may develop. Thus, filling the vessel beyond 85% is not recommended.

A potential hazard is posed by the high pressures developed in a vessel that is preferably fused silica. Consequently, a protective jacket is preferably placed around the vessel. A steel jacket is suitable and is designed to surround about 95 percent of the vessel, with the remaining open area providing windows only large enough to permit convenient viewing of the process in the vessel. The end caps of the jacket serve to hold in place the fluoropolymer plugs at the ends of the tube.

The heating means may be any of several known in the art. A cylindrical furnace having two independently-controlled resistance heating zones is suitable for achieving the elevated temperature and temperature gradient in the vessel. The temperatures are measured exterior to the vessel, for example using thermocouples, and provide an adequate approximation to the interior temperatures. Temperatures are controlled at the centers of the chambers and may vary by about ±3° C. within each chamber. Conventional controllers capable of maintaining control temperatures within about ±1° C. of the desired temperatures may be used. If the vessel has three chambers, a three-zone furnace is necessary. The vessel is heated to achieve a seed crystal temperature in the range from about 135° C. to 210° C., with about 170° C. preferred. (A higher temperature range, about 170°-210° C., is preferred for $GaPO_4$ crystal growth, with about 185° C. most preferred). A gradient is established, so that the nutrient is at a temperature about 5° C. to 30° C. lower than that of the seed crystals, preferably about 10° C. lower. The nutrient should remain above 130° C., where berlinite undergoes a phase change and the solution chemistry is changed. If the temperature of a growing crystal is too high, excessive nucleation takes place. If the temperature gradient is too large, excessive nucleation also takes place, and, furthermore the solution boils in the region of the growing crystals. If the temperature is too low, growth is very slow.

With the seed crystals and nutrient immersed in the phosphoric acid and the elevated temperature and temperature gradient established, the seed crystals begin to grow by the following mechanism:

Since berlinite shows retrograde solubility, the lower-temperature nutrient goes into solution. At the higher temperature of the seed crystals, the solution is super-saturated in berlinite. The berlinite comes out of solution and deposits on the seed crystals, causing them to grow. As the process continues, there is a continual depletion of nutrient in the second chamber and a corresponding growth on the seed crystals.

To enhance the flow of berlinite-enriched solution toward the seed crystal and depleted solution toward the nutrient, the vessel is rocked about a horizontal axis normal to its cylinder axis. The rocking action is accomplished by methods well known in the art, such as a motor drive. Each end of the vessel may be raised and lowered at regular intervals of about 6 to about 1800 seconds, with the preferred interval range being about 10 to 30 seconds. As the vessel is rocked, preferably the nutrient and growing crystals remain submerged. This goal is achieved by using the maximum feasible fill, as discussed above; by not mounting seed crystals or positioning nutrient near the top and ends of the vessel; and by limiting the rocking so that the raised end of the vessel preferably makes with the horizontal an angle of less than 45°, more preferably less than 10°.

By the mechanism described above, and at a rate enhanced by the rocking motion, the berlinite seed crystals grow in the solution when the temperature and temperature gradient are within the appropriate range. After about two weeks, the crystal attains a usable size; however, larger crystals are preferred, requiring a growth period of at least about a month. Growth is stopped when the crystals reach the desired size, or before that if the crystals are coming into contact with the walls or if the nutrient is nearly depleted. Growth should not continue until the nutrient is depleted, since then the crystals go into solution.

Because of berlinite's retrograde solubility, there is a tendency for the crystals to go into solution as the vessel is cooled after growth is complete. Consequently, the vessel is cooled rapidly to near ambient temperature, for example by spraying the vessel with water. Cooling may be accomplished in this way in about 10–15 minutes, after which the crystals can be removed from the solution. If more rapid cooling is attempted, there is a danger that the crystals might crack. After recovering them from the solution, crystals grown by the present process are cut into wafers for SAW devices, using conventional slicing machines.

An alternative method for recovering the crystals after growth is complete involves a second (or syringe) vessel. The syringe vessel includes means for pumping solution into and out of the pressure vessel, for example a piston mounted in the syringe vessel and one or more high-pressure, corrosion-resistant valves to control flow between the vessels. In a preferred embodiment when crystal growth is complete, the syringe vessel is joined to the pressure vessel and hot solution is transferred to the syringe vessel. Thereafter, the crystals in the pressure vessel may be cooled slowly to avoid cracking, since they can no longer go into solution. If two valves are used between the vessels, then one syringe vessel can serve several pressure vessels. The syringe vessel can also be used to prevent dissolution of the seed crystal as the system is warmed at the beginning of the process. The acid is heated in the syringe vessel as the nutrient and seeds are heated in the pressure vessel. when the desired temperatures are achieved, the hot acid is transferred from the syringe vessel to the pressure vessel.

The apparatus of the present invention is further described with reference to the Figures. Where an element of the apparatus appears in more than one Figure, it retains the same reference number in each.

FIG. 1 depicts a schematic of the apparatus of the present invention. The pressure vessel is enclosed in a steel jacket, surrounded by a furnace 10. The progress of the crystal growing can be observed through windows 11. Temperatures in the two chambers of the vessel are controlled by temperature controllers 12 and 13. The apparatus is rocked about an axis 14 by motor 15, joined to the vessel through arm 16. Motor speed may be controlled by controller 17.

Figure 2:
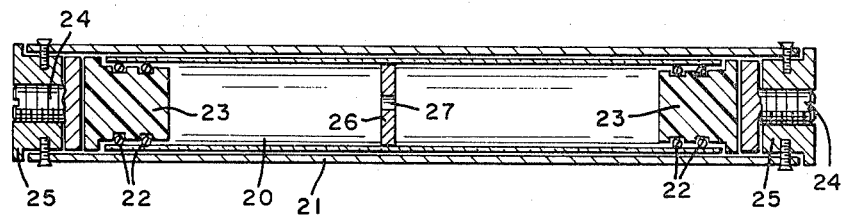
FIG. 2 is a sectional view of a pressure vessel and jacket of the present invention.

FIG. 2 shows a pressure vessel and jacket of the present invention in cross section. Pressure vessel 20 is a transparent material, for example fused silica, and jacket 21 may be of steel. Pressure vessel 20 is sealed at its ends by elastomer O-rings 22 and fluoropolymer plugs 23. The plugs 23 are held in place by threaded end caps 24 of jacket plugs 25. The two chambers of the pressure vessel are separated by baffle 26, having through-hole 27.

Figure 3:
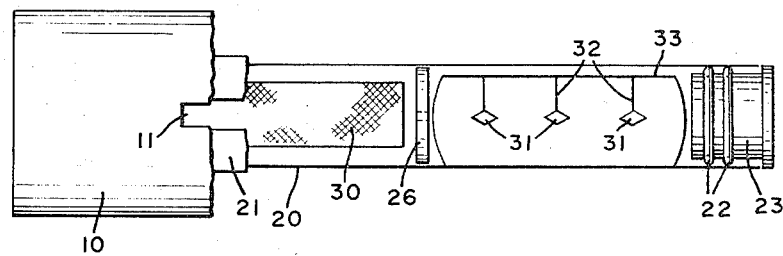
FIG. 3 is a partially cut-away side view of a fully-loaded apparatus of the present invention.

FIG. 3 shows a cut-away side view of the apparatus loaded with nutrient, in nutrient bag 30, and with seed crystals 31. Seed crystals 31 are supported from hangers 32, which, in turn, are suspended from frame 33.

Figure 4:
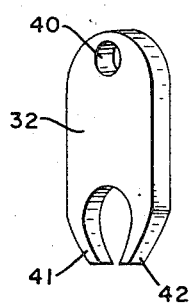
FIG. 4 shows a seed hanger of the present invention.

A seed hanger is shown in an enlarged view in FIG. 4. A hole 40 in the top permits the hanger to be supported by the frame. Fingers 41 and 42 grip the seed without damaging or requiring a hole to be drilled into the seed.

Figure 5:
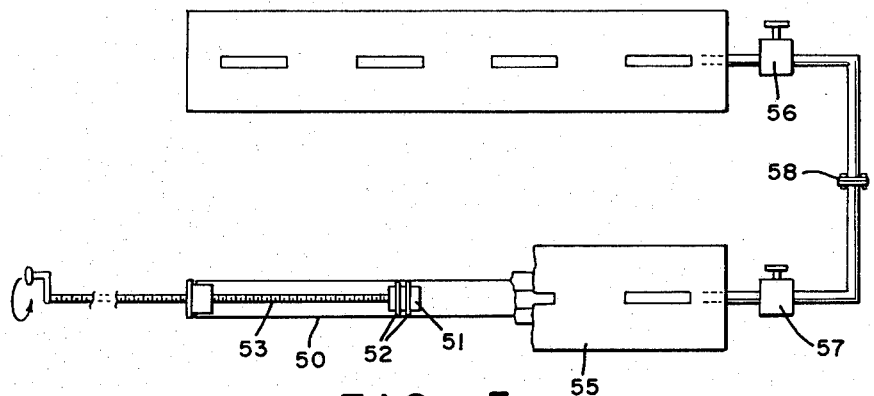
FIG. 5 is a partially cut-away side view of another embodiment of the present invention.

FIG. 5 shows an embodiment of the present invention in which a syringe vessel 50 is used to hold acid before crystal growth begins and after it is completed. Fluid is pumped into and out of syringe vessel 50 by driving fluoropolymer plug 51 to the left and right respectively. Plug 51 is sealed against the syringe vessel wall with O-ring 52 and is mounted on threaded rod 53. Jacket 54 and furnace 55 surrounds the syringe vessel for heating the acid before it is pumped into the pressure vessel. Valves 56 and 57 control the flow between the vessels, and connection 58 permits a single syringe vessel to service several pressure vessels.

The following examples are presented in order to provide a more complete understanding of the invention. The specific techniques, conditions, materials, and reported data set forth to illustrate the principles and practice of the invention are exemplary and should not be construed as limiting the scope of the invention.

EXAMPLE 1

Single crystals of berlinite were grown in a horizontally-oriented, fused silica pressure vessel, 1 m long $\times$ 3 cm ID. A PTFE baffle divided the vessel into two communicating chambers. One chamber was loaded with 25 berlinite seed crystals, all basal (0001) plates, and the other chamber with coarse berlinite crystalline powder (45–60 mesh). After adding 7.3 M $H_3PO_4$ to the vessel, the starting materials occupied nearly 85% of the vessel volume. The vessel was then sealed. The chamber holding the seed crystals was heated to 165° C. (in the center of the chamber) and the chamber holding the nutrient to 153° C. (in the center). The temperatures were maintained and the vessel rocked with a period of 10 s/cycle. At the extremes of the rocking, the long dimension of the vessel made an angle of 5° with the horizontal. After 59 days, a water spray cooled the vessel to near ambient temperature in less than 15 minutes, and the crystals were recovered from the solution. Originally about 1 mm thick, the crystals had grown to a thickness that ranged from 18–27 mm.

EXAMPLE 2

The apparatus of EXAMPLE 1 was loaded with 61 mm-thick $GaPO_4$ Y-plate seed crystals ($10\bar{1}0$) in one chamber and coarse $GaPO_4$ crystalline powder (20–45 mesh) in the other. After adding 10 M $H_3PO_4$ to the vessel, the starting materials occupied nearly 85% of the vessel volume. The sealed vessel was heated such that the temperature of the center of the seed crystal chamber was 177° C. and the center of the nutrient chamber was 167° C. These temperatures were maintained for 55 days. The vessel was rocked during growth and cooled afterwards as was described in EXAMPLE 1. $GaPO_4$ crystals 10.5 mm thick were recovered.

EXAMPLE 3

The vessel of EXAMPLE 1 was divided into three nominally equal-sized communicating chambers by two PTFE baffles. The central chamber was loaded with 8 1 mm-thick berlinite rotated Y ($10\bar{1}0$) plates. The two end chambers were loaded with coarse berlinite crystalline powder. Phosphoric acid (7.3 M) was added to render the vessel nearly 85% full. The vessel was then sealed. Using a three-zone heater, the center of the seed crystal chamber was heated to 169° C., the centers of the two nutrient chambers to 152° C. One end of the vessel was raised to cause the vessel to make a 5° angle with the horizontal. At two-hour intervals the vessel was rocked by raising the opposite end of the vessel. After maintaining the temperature and rocking for 64 days, a water spray cooled the vessel to near ambient temperature in less than 15 minutes and the crystals were recovered from the solution. The crystals had grown to thicknesses that ranged from 6–12 mm.

EXAMPLE 4

The apparatus of EXAMPLE 1 was supplemented by a syringe vessel adapted for pumping liquids into and out of the pressure vessel without the need to first release the pressure. The pressure vessel was loaded with 9 1 mm-thick berlinite rotated Y ($10\bar{1}0$) plates and coarse berlinite crystalline powder (25–45 mesh). After being sealed, the pressure vessel was heated to provide temperatures of 167° C. in the center of the seed crystal chamber and 145° C. in the center of the nutrient chamber. At the same time, the syringe vessel was loaded with 7.3 M $H_3PO_4$ and heated to 165° C. The hot acid was then pumped from the syringe vessel into the pressure vessel, causing the latter to be nearly 85% full of starting materials. (The 22° temperature gradient was restored by cooling the nutrient chamber). The crystal and nutrient temperatures were maintained while the pressure vessel was rocked as described in EXAMPLE 1. After 36 days, the hot solution was pumped into the syringe vessel and the pressure vessel was cooled slowly over a period of several hours. Berlinite crystals about 4 mm thick were then recovered.

We claim:

1. A process for growing single crystals of a metal orthophosphate selected from the group consisting of alpha-aluminum orthophosphate and alpha-gallium orthophosphate, comprising the steps of:

(a) suspending a seed crystal of the metal orthophosphate in a first chamber of a substantially horizontally-oriented pressure vessel, said first chamber being partitioned from at least one additional chamber so that a temperature gradient can be maintained and fluid can flow between the chambers, (b) introducing into a second chamber of the vessel a quantity of coarse crystalline powder of the metal orthophosphate, and then, sequentially, (c) partially filling the vessel with concentrated phosphoric acid, (d) sealing the vessel, (e) heating the vessel to achieve a seed crystal temperature in the range from about 135° C. to 210° C. and a powder temperature about 5° C. to 30° C. lower, (f) maintaining the temperatures in the vessel while rocking the vessel about a horizontal axis to raise first one chamber of the vessel and then another, whereby the seed crystal grows from an acid solution of the metal orthophosphate, (g) cooling the vessel to near ambient temperature, and (h) recovering the resultant single crystal.

2. The process of claim 1 in which the metal orthophosphate is aluminum-orthophosphate.

3. The process of claim 2 in which the acid molarity is in the range from about 5 to about 9 M.

4. The process of claim 3 in which the acid molarity is about 7.3 M.

5. The process of claim 2 in which the vessel is heated to provide a seed crystal temperature of about 170° C.

6. The process of claim 1 in which the metal orthophosphate is gallium-orthophosphate.

7. The process of claim 6 in which the acid molarity is in the range from about 8 to about 12 M.

8. The process of claim 7 in which the acid molarity is about 10 M.

9. The process of claim 6 in which the vessel is heated to provide a seed crystal temperature of about 185° C.

10. The process of claim 1 in which a powder temperature about 10° C. lower than that of the seed crystal is maintained.

11. The process of claim 1 in which a plurality of seed crystals are suspended in the first chamber.

12. The process of claim 1 in which the powder size is about 20–60 mesh.

13. The process of claim 1 in which the powder is contained in a pervious enclosure.

14. The process of claim 1 in which the quantity of acid, powder, and seed crystal are chosen so that they fill less than about 85 percent of the volume of the vessel.

15. The process of claim 1 in which the rocking is accomplished by raising and lowering an end of the vessel at regular intervals of about 6 to about 1800 seconds.

16. The process of claim 15 in which the regular interval is about 10 to about 30 seconds.

17. The process of claim 1 in which the angle that the raised end of the vessel makes with the horizontal is less than about 45°.

18. The process of claim 17 in which the angle that the raised end of the vessel makes with the horizontal is less than about 10°.

19. The process of claim 1 in which cooling of the vessel to near ambient temperature is accomplished in less than about 15 minutes.

20. The process of claim 1 further comprising the step of removing the solution after step (f) but before step (g).

21. A process for growing single crystals of a metal orthophosphate selected from the group consisting of alpha-aluminum orthophosphate and alpha-gallium orthophosphate, comprising the steps of:
(a) suspending a seed crystal of the metal orthophosphate in a first chamber of a substantially horizontally-oriented pressure vessel, said first chamber being partitioned from at least one additional chamber so that a temperature gradient can be maintained and fluid can flow between the chambers,
(b) introducing into a second chamber of the vessel a quantity of coarse crystalline powder of the metal orthophosphate, and then, sequentially, (c) sealing the vessel,
(d) heating the vessel to achieve a seed crystal temperature in the range from about 135° C. to 210° C. and a powder temperature about 5° C. to 30° C. lower,
(e) partially filling the vessel with concentrated phosphoric acid,
(f) maintaining the temperatures in the vessel while rocking the vessel about a horizontal axis to raise first one chamber of the vessel and then another, whereby the seed crystal grows from an acid solution of the metal orthophosphate,
(g) cooling the vessel to near ambient temperature, and
(h) recovering the resultant single crystal.

* * * * *